(12) United States Patent
Lin (10) Patent No.: US 9,136,863 B2
(45) Date of Patent: Sep. 15, 2015

(54) SUCCESSIVE APPROXIMATION ANALOG-TO-DIGITAL CONVERTER AND CONVERSION METHOD

(71) Applicant: REALTEK SEMICONDUCTOR CORPORATION, Hsinchu (TW)

(72) Inventor: Sheng-Hsiung Lin, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/585,812

(22) Filed: Dec. 30, 2014

(65) Prior Publication Data

US 2015/0229321 A1 Aug. 13, 2015

(30) Foreign Application Priority Data

Feb. 10, 2014 (TW) .............................. 103104318 A (51) Int. Cl.
*H03M 1/12* (2006.01)
*H03M 1/38* (2006.01)

(52) U.S. Cl.
CPC .............. *H03M 1/38* (2013.01); *H03M 1/1245* (2013.01)

(58) Field of Classification Search
CPC ....... H03M 1/468; H03M 1/68; H03M 1/804; H03M 1/004; H03M 1/1225; H03M 1/002; H03M 1/1245; H03M 1/38; H03M 1/466
USPC .......................... 341/118, 120, 122, 155, 172
See application file for complete search history.

(56) References Cited

U.S. PATENT DOCUMENTS

| | | | | |
|---|---|---|---|---|
| 5,684,487 A | * | 11/1997 | Timko | 341/172 |
| 5,920,275 A | * | 7/1999 | Hester | 341/172 |
| 6,486,806 B1 | * | 11/2002 | Munoz et al. | 341/120 |
| 6,720,903 B2 | * | 4/2004 | Confalonieri et al. | 341/172 |
| 6,897,801 B2 | * | 5/2005 | Confalonieri et al. | 341/172 |
| 7,834,796 B2 | * | 11/2010 | Xu et al. | 341/172 |
| 7,876,254 B2 | * | 1/2011 | Berens et al. | 341/163 |
| 8,031,099 B2 | * | 10/2011 | Zhao et al. | 341/150 |
| 2004/0233093 A1 | * | 11/2004 | Confalonieri et al. | 341/172 |
| 2009/0167587 A1 | * | 7/2009 | Xu et al. | 341/172 |
| 2009/0273501 A1 | * | 11/2009 | Madhavan et al. | 341/158 |

* cited by examiner

*Primary Examiner* — Linh Nguyen
(74) *Attorney, Agent, or Firm* — WPAT, P.C.; Anthony King (57) ABSTRACT

The present invention discloses a successive approximation analog-to-digital converter, comprising: a capacitor array including a designated capacitor and several sampling capacitors to sample an input signal under a sampling mode; a comparator to compare a first voltage from the capacitor array with a second voltage under a comparison mode and thereby generate a comparison result; a switching circuit to determine the charge amount stored in the capacitor array under the sampling mode and the first voltage under the comparison mode according to a control signal; and a control circuit to generate the control signal according to a sampling setting under the sampling mode and generate the control signal according to the comparison result under the comparison mode. Said designated capacitor does no sampling under the sampling mode, but appropriates the charges of the sampling capacitors under the comparison mode, so as to reduce the effective sampling value.

17 Claims, 8 Drawing Sheets

SUCCESSIVE APPROXIMATION ANALOG-TO-DIGITAL CONVERTER AND CONVERSION METHOD

BACKGROUND OF THE INVENTION

1. Field of the Invention

The present invention relates to analog-to-digital conversion technique, especially to the technique of successive approximation analog-to-digital converter and conversion method.

2. Description of Related Art

A successive approximation analog-to-digital converter is operable to carry out a binary search to an analog input signal in accordance with every available quantization level of the converter itself, and thereby generate a digital output signal. Among all kinds of successive approximation analog-to-digital converters, a charge redistribution successive approximation analog-to-digital converter is a common choice for actual implementation. This kind of converter samples an analog input signal through a capacitor array, and connects the bottom electrodes of a plurality of capacitors in the capacitor array with a reference voltage in an order conforming to the capacities of these capacitors and a comparison result after the sampling finishes, so that the voltages outputted by the capacitor array (i.e. the voltages of the top electrodes of the plurality of capacitors) will vary due to the conservation of charges. Afterwards, the converter will compare the voltages outputted by the capacitor array with the output voltages of another capacitor array or a constant voltage to generate the aforementioned comparison result, and thus generate a digital output signal according to the comparison result.

To a device (e.g. an image decoder) using the above-described charge redistribution successive approximation analog-to-digital converter, if the peak value of the said analog input signal (e.g. an image signal) goes beyond the quantization resolution of this analog-to-digital converter, the digital output signal generated thereafter will lack fidelity. Accordingly, the current art makes use of a programmable gain amplifier (PGA) to adjust the peak value of the analog input signal, so as to prevent the problem of fidelity loss. However, since a programmable gain amplifier has the features of large circuitry area and high power consumption, the adoption of such an amplifier will lead to the problems of cost increase and power consumption; as a result, this technique field still needs a better solution capable of preventing fidelity loss while giving consideration of cost control and power saving.

SUMMARY OF THE INVENTION

An object of the present invention is to provide a successive approximation analog-to-digital converter and conversion method capable of improving the prior art.

The present invention discloses a successive approximation analog-to-digital converter capable of determining the sampling value of an input signal. An embodiment of said converter comprises: a first capacitor array operable to sample a first input signal under a sampling mode, including a plurality of first capacitors which include at least a first designated capacitor and at least a first sampling capacitor while each of the first capacitors includes a first upper electrode terminal and a first lower electrode terminal; a comparator operable to compare a first voltage from the first capacitor array with a second voltage under a comparison mode and thereby generate a comparison result; a first switching circuit, coupled with the first capacitor array, operable to determine the charge amount stored in the first capacitor array according to a first control signal under the sampling mode and determine the first voltage outputted from the first capacitor array according to the first control signal under the comparison mode; and a control circuit, coupled with the comparator and the first switching circuit, operable to generate the first control signal according to a sampling setting under the sampling mode and generate the first control signal according to the comparison result under the comparison mode, wherein the first control signal is operable to prevent the at least one first designated capacitor from sampling the first input signal through the first switching circuit under the sampling mode while making the at least one first sampling capacitor sample the first input signal, and operable to stop the first capacitor array from sampling through the first switching circuit under the comparison mode while making the at least one first designated capacitor and the least one first sampling capacitor share charges.

The present invention also discloses a successive approximation analog-to-digital conversion method capable of determining the sampling value of an input signal. An embodiment of the method can be carried out by the successive approximation analog-to-digital converter of the present invention or the equivalent thereof, and comprises the following steps: under a sampling mode, sampling a first input signal through a first capacitor array including at least a first designated capacitor and at least a first sampling capacitor; under a comparison mode, comparing a first voltage from the first capacitor array with a second voltage and thereby generating a comparison result in which the second voltage is related to a second input signal which is the inversion of the first input signal or a predetermined reference signal; under the sampling mode, determining the charge amount stored in the first capacitor array through a first control signal which prevents the at least one first designated capacitor from sampling the first input signal by controlling a first switching circuit while making the at least one first sampling capacitor sample the first input signal; under the comparison mode, determining the first voltage outputted by the first capacitor array through the first control signal which stops the first capacitor array from sampling by controlling the first switching circuit while making the at least one first designated capacitor and the at least one first sampling capacitor share charges; and generating the first control signal according to a sampling setting under the sampling mode, and generating the first control signal according to the comparison result under the comparison mode.

Another embodiment of the aforementioned successive approximation analog-to-digital conversion method comprises: receiving a first input signal; sampling the first input signal through a first capacitor array and thereby generating a plurality of first original sampling values; generating a plurality of comparison results by comparing the first original sampling values with a plurality of second original sampling values or a reference value; determining whether the variation of the comparison results conforms to a predetermined pattern; and if the variation of the comparison results conforms to the predetermined pattern, adjusting the first capacitor array, and then sampling the first input signal through the first capacitor array again to generate a plurality of first adjusted sampling values, wherein the maximum of the first adjusted sampling values is less than the maximum of the first original sampling values.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this invention field. If any term is defined in this specification, such term should be explained accordingly. Besides, the connection between objects or events in the below-described embodiments can be direct or indirect provided that these embodiments are still practicable under such connection. Said "indirect" means that an intermediate object or a physical space exists between the objects, or an intermediate event or a time interval exists between the events.

The present invention discloses a successive approximation analog-to-digital converter and conversion method, and a decoder adopting the same, which are capable of reducing the sampling value of an input signal (in which the sampling value intends its absolute value if the input signal is negative in the definition of circuitry operation), that is to say achieving the decrease in the effective sampling amount of the input signal, so as to avoid the fidelity loss caused by the overly high peak value of the input signal. The present invention is applicable to an integrated circuit (e.g. an analog front end (AFE) circuit) or a system device (e.g. an image decoding device). Provided that an alternative means is available and reasonable, people of ordinary skill in the art can use such means similar or equivalent to those described in this specification to carry out the present invention, which implies that the scope of this invention is not limited to the embodiments in this specification. On account of that some element of the hardware of the present invention could be known, the detail of such element will be omitted as long as this omission nowhere dissatisfies the specification and enablement requirements. Besides, the method of the present invention can be in the form of firmware and/or software which could be carried out by the device of this invention or its equivalent; therefore, provided that the remaining disclosure is still enough for understanding and enablement, the following description will abridge the hardware details for carrying out the method, but put the emphasis on the steps. Moreover, each embodiment in the following description includes one or more features; however, this doesn't mean that one carrying out the present invention should make use of all the features of one embodiment at the same time, or should only carry out different embodiments separately. In other words, if an implementation derived from one or more of the embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

Figure 1A:
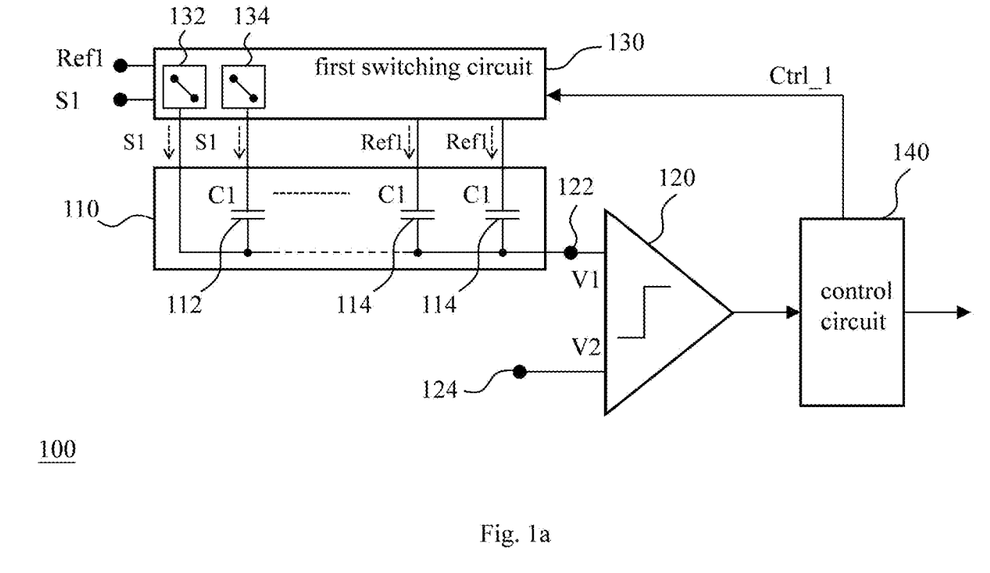
FIG. 1a illustrates an embodiment of the successive approximation analog-to-digital converter of the present invention under a sampling mode.
Figure 1B:
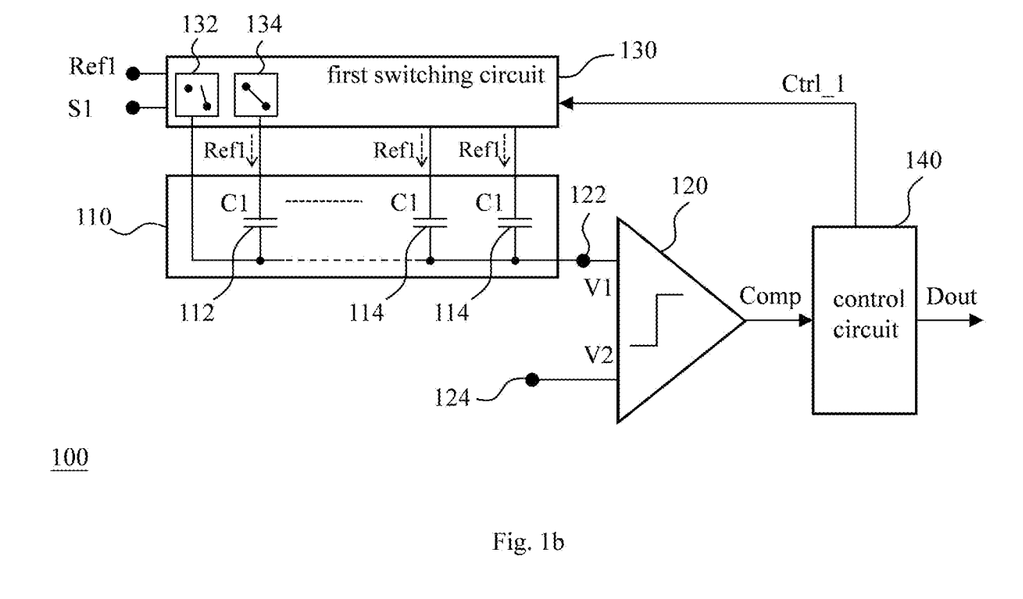
FIG. 1b illustrates an embodiment of the successive approximation analog-to-digital converter of the present invention under a comparison mode.

Please refer to FIG. 1a and FIG. 1b which illustrates an embodiment of the successive approximation analog-to-digital converter of the present invention in which FIG. 1a represents the converter operating under a sampling mode while FIG. 1b represents the converter operating under a comparison mode. As it is shown in the figures, the successive approximation analog-to-digital converter 100 of this embodiment comprises: a first capacitor array 110; a comparator 120; a first switching circuit 130; and a control circuit 140. Said first capacitor 110 is operable to sample a first input signal S1 under the mentioned sampling mode, and includes a plurality of first capacitors C1 including at least a first designated capacitor 112 and at least a first sampling capacitor 114 while each of the first capacitors C1 includes a first upper electrode terminal and a first lower electrode terminal and could be a capacitor with or without polarities. Said comparator 120 includes a first input end 122 and a second input end 124 operable to compare a first voltage V1 from the first capacitor array 110 with a second voltage V2 under the mentioned comparison mode, so as to generate a comparison result Comp. In this way, a plurality of comparison results Comp will be generated, and indicate a plurality of bits from the most significant bit (MSB) of a digital output signal Dout to the least significant bit (LSB) of the digital output signal Dout in turn according to the production sequence of the bits. Said first switching circuit 130 is coupled with the first capacitor array 110, operable to determine the charge amount stored in the first capacitor array 110 in accordance with a first control signal Ctrl_1 under the sampling mode, and operable to determine the first voltage V1 outputted by the first capacitor array 110 according to the first control signal Ctrl_1 under the comparison mode. Said control circuit 140 is coupled with the comparator 120 and the first switching circuit 130, operable to generate the first control signal Ctrl_1 in accordance with a sampling setting under the sampling mode (as it is shown in FIG. 1a), and operable to generate the first control signal Ctrl_1 according to the comparison result Comp under the comparison mode (as it is shown in FIG. 1b). More specifically, as it is shown in FIG. 1a, the first control signal Ctrl_1 will prevent the first designated capacitor 112 from sampling the first input signal S1 through the first switching circuit 130 under the sampling mode while allowing the first sampling capacitor 114 sampling the first input signal S1; besides, as it is shown in FIG. 1b, the first control signal Ctrl_1 will stop the first capacitor 110 from sampling through the first switching circuit 130 under the comparison mode while making the first designated capacitor 112 and the first sampling capacitor 114 share charges, so as to generate the initial value of the first voltage V1 (i.e. the sampling value of the first input signal S1) for the following comparison procedure. Please note that after the initial value of the first voltage V1 has been generated, the converter 100 of the present embodiment could generate the following comparison result (s) Comp one by one with the said comparison manner and thereby generate the digital output signal Dout. Please also note that the control circuit 140 can not only choose one among the first capacitors C1 as the first designated capacitor 112 through the first switching circuit 130 according to the aforementioned sampling setting, but also analyze a preceding digital output signal Dout (that is to say the result from a preceding comparison procedure), so that the control circuit 140 is able to choose some other first capacitor(s) C1 as the first designated capacitor 112 through the first switching circuit 130 for performance improvement when the analysis indicates the fidelity loss of the input signal or other problems.

Please refer to FIG. 1a again. The first switching circuit 130 includes a first input switch 132 and a first sampling control switch 134. Under the sampling mode, the first control signal Ctrl_1 couples the first upper electrode terminal of the first designated capacitor 112 with the first input signal S1 through the first input switch 132, and couples the first lower electrode terminal of the first designated capacitor 112 with the first input signal S1 as well through the first sampling control switch 134, so as to prevent the first designated capacitor 112 from sampling the first input signal S1. Furthermore, under the sampling mode, the first control signal Ctrl_1 couples the two ends of the first sampling capacitor 114 with the first input signal S1 and a first reference signal Ref1 respectively through the first switching circuit 130, so as to make the first sampling capacitor 114 sample the first input signal S1. On the other hand, please refer to FIG. 1b; under the comparison mode, the first control signal Ctrl_1 disconnects the first upper electrode terminal of the first designated capacitor 112 from the first input signal S1 through the first input switch 132, couples the first lower electrode terminal of the first designated capacitor 112 with the first reference signal Ref1 through the first sampling control switch 134, and achieves the sharing of charges through the connection between the first upper electrode terminals of the first designated capacitor 112 and the first sampling capacitor 114. As a result, the effective output voltage (i.e. the first voltage V1) of the first capacitor array 110 is determined, which means that the effective sampling value of the first input signal S1 is determined.

In light of the above, providing the analog-to-digital converter 100 of this embodiment is a 3-bit converter, the first capacitor array 110 includes four first capacitors C1 whose capacitances are 4C, 2C, C, C in the order of their capacities while the capacitance of the first designated capacitor 112 is 4C and the rest of the capacitors C1 are treated as the first sampling capacitor 114, the first input signal S1 is expressed with a common mode voltage Vcm plus the amplitude Vin/2 of the signal S1 (i.e. (Vcm+Vin/2)), and the first reference signal Ref1 is expressed with the common mode voltage Vcm plus a reference voltage Vr (i.e. (Vcm+Vr)), the charge amount Qt stored in the capacitor array 110 at the end of the sampling mode will be the one in the following Equation 1:

$$Qt=4C\times(S1-S1)+(2C+C+C)\times(S1-Ref1)$$

$$=4C\times[(Vcm+Vin/2)-(Vcm+Vr)]$$

$$=4C\times[(Vin/2)-Vr]$$

$$=2C\times Vin-4C\times Vr \quad \text{(Equation 1)}$$

Next, after the charge sharing (i.e. charge redistribution) has finished for the first time under the comparison mode, the charge amount Qt stored in the first capacitor array 110 will be the one in the following Equation 2:

$$Qt=4C\times(V1-Ref1)+(2C+C+C)\times(V1-Ref1)$$

$$=8C\times[V1-(Vcm+Vr)]$$

$$=8C\times V1-8C\times Vcm-8C\times Vr \quad \text{(Equation 2)}$$

In consideration of the conservation of charges being true in spite of the charge sharing, the initial value of the first voltage V1 can be derived from Equation 1 and Equation 2 as follows:

$$2C\times Vin-4C\times Vr=8C\times V1-8C\times Vcm-8C\times Vr$$

$$8C\times V1=2C\times Vin+4C\times Vr+8C\times Vcm$$

$$V1=Vin/4+Vr/2+Vcm \quad \text{(Equation 3)}$$

Accordingly, compared with the prior art which will make use of all capacitors for sampling and obtain the initial value of the first voltage V1 being (Vin/2+Vcm) theoretically, the present embodiment is operable to change the initial value (i.e. the utmost value) of the first voltage V1 to (Vin/4+Vr/2+Vcm) and thereby prevents the problem of fidelity loss caused by the overly high peak (Vin/2) of the first input signal S1. Please note that although the capacitor with the maximum capacitance (i.e. 4C) is taken for the first designated capacitor 112 in the above-illustrated example, this is not a limitation to the scope of the present invention. In effect, another capacitor among the first capacitor array 110 could be taken for the first designated capacitor 112 instead, e.g. the capacitor of the capacitance other than 4C or any available combination of the capacitors such as those of the capacitances 2C and C. In brief, the more the capacitance of the first designated capacitor 112 is, the more the reduction in the initial value of the first voltage V1 is, which implies that the sampling value of the input signal S1 is further reduced. Please note that the percentage of the reduction in the sampling value of the input signal S1 is determined by the ratio of the total capacitance of the first capacitor array 110 to the capacitance of the first designated capacitor 112.

Figure 2A:
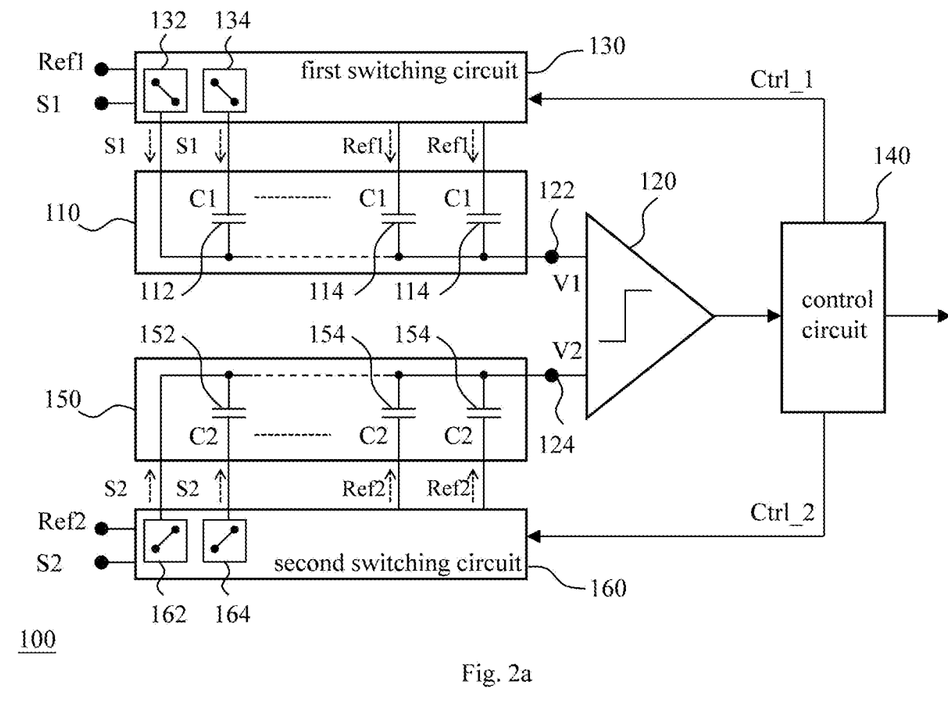
FIG. 2a illustrates an embodiment of the successive approximation analog-to-digital converter with a differential input of the present invention under a sampling mode.
Figure 2B:
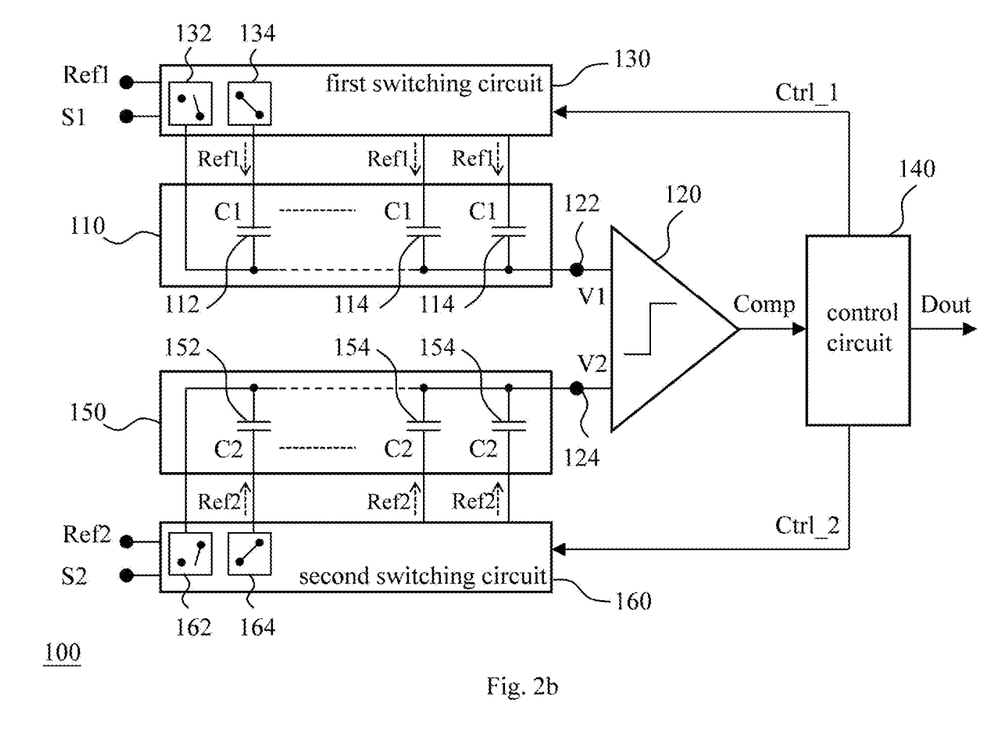
FIG. 2b illustrates an embodiment of the successive approximation analog-to-digital converter with a differential input of the present invention under a comparison mode.

Please refer to FIG. 1a and FIG. 1b again. If the converter 100 of this embodiment is a converter of single-ended input, the aforementioned second voltage V2 could be a predetermined reference signal (e.g. a grounding voltage or a DC voltage); but if the converter 100 is a converter of differential input, then the second voltage V2 could be an output voltage from another capacitor array. As it is illustrated in FIG. 2a and FIG. 2b, if the input type of the converter 100 is differential, the converter 100 will further comprise: a second capacitor array 150 and a second switching circuit 160. Said second capacitor array 150 includes a plurality of second capacitors C2 including at least a second designated capacitor 152 and at least a second sampling capacitor 154 while each of the second capacitors C2 includes a second upper electrode terminal and a second lower electrode terminal, and is operable to sample a second input signal S2 which is the inversion of the first input signal S1 under the sampling mode (as shown in FIG. 2a); in this case, the comparator 120 is operable to receive the second voltage V2 outputted by the second capacitor array 150 and compare the second voltage V2 with the first voltage V1 under the comparison mode (as shown in FIG. 2b). Said second switching circuit 160 is coupled with the second capacitor array 150, operable to determine the charge amount stored in the second capacitor array 150 according to a second control signal Ctrl_2 under the sampling mode (as shown in FIG. 2a), and operable to determine the output voltage (i.e. the second voltage V2) of the second capacitor array 150 according to the second control signal Ctrl_2 under the comparison mode (as shown in FIG. 2b); in this case, the control circuit 140 is operable to generate the second control signal Ctrl_2 according to the aforementioned sampling setting (or a setting including the same) under the sampling mode, and generate the second control signal Ctrl_2 according to the comparison result Comp under the comparison mode. The control signal Ctrl_2 will prevent the second designated capacitor 152 from sampling the second input signal S2 through the second switching circuit 160 under the sampling mode while making the at least one second sampling capacitor 154 of the other second capacitor(s) C2 sample the second input signal S2; furthermore, the control signal Ctrl_2 will stop the second capacitor array 150 from proceeding with sampling through the second switching circuit 160 under the comparison mode, and then make the second designated capacitor 152 and the second sampling capacitor 154 share the charges.

As it is illustrated in the description on the operation of the first switching circuit 130, the second switching circuit 160 similarly includes a second input switch 162 and a second sampling control switch 164. Under the sampling mode, the second control signal Ctrl_2 is operable to couple the upper electrode terminal of the second designated capacitor 152 with the second input signal S2 through the second input switch 162, couple the lower electrode terminal of the second designated capacitor 152 with the second input signal S2 as well through the second sampling control switch 164, and couple the two ends of the second sampling capacitor 154 with the second input signal S2 and a second reference signal Ref2 respectively through the second switching circuit 160. Under the comparison mode, the second control signal Ctrl_2 is operable to disconnect the second upper electrode terminal of the second designated capacitor 152 from the second input signal S2 through the second input switch 162, couple the second lower electrode terminal of the second designated capacitor 152 with the second reference signal Ref2 through the second sampling control switch 164, and carry out charge sharing through the connection between the second upper electrode terminals of the second designated capacitor 152 and the second sampling capacitor 154.

In the present embodiment, the configuration and operation of the first and second capacitor arrays 110, 150 are analogous, in which the capacitances of the first and second designated capacitors 112, 152 are equivalent, the capacitances of the first and second sampling capacitors 114, 154 are equivalent, and the first and second reference signals Ref1, Ref2 are equivalent. Besides, after the comparator 120 has completed the comparison for the first time in an independent comparison procedure, if the first voltage V1 is higher than the second voltage V2 (i.e. the most significant bit is 1), the control circuit 140 will couple the lower electrode terminal of the maximum capacitor in the first capacitor array 110 to a third reference signal Ref3 instead of the first reference signal Ref1 in accordance with this comparison result Comp (while the voltage of the third reference signal Ref3 here is lower than the voltage of the first reference signal Ref1), and then carry out the comparison for the second time. Afterwards, if the comparison result Comp this time indicates that the first voltage V1 is lower than the second voltage V2 (i.e. the secondary significant bit is 0), the control circuit 140 will couple the lower electrode terminal of the secondary large capacitor in the second capacitor array 150 to a fourth reference signal Ref4 rather than the second reference signal Ref2 (while the fourth reference signal Ref4 is equal to the third reference signal Ref3 here), and then proceed with the following comparison procedure in a similar way. Since the above-described comparison manner pertains to the prior art and could be replaced by other comparison manners as long as the consequent implementation is practicable, unnecessary description is therefore omitted while giving enough consideration to the disclosure and enablement requirements. Please note that although the upper electrode terminal of the designated capacitor in the fore-disclosed embodiments is kept connected with the upper electrode terminal of the sampling capacitor, people of ordinary skill in the art may have the two kinds of capacitors operate separately during sampling through modifying the configuration of the switching circuit by referring to the disclosure of the present invention, so as to fulfill the purpose of preventing the designated capacitor from sampling while making the sampling capacitor execute sampling. In other words, the connection relationship between the designated and sampling capacitors is not limited to the teaching of the above embodiments, but allowed to be altered by those of ordinary skill in the art according to the disclosure in this specification and their requirement.

Figure 3A:
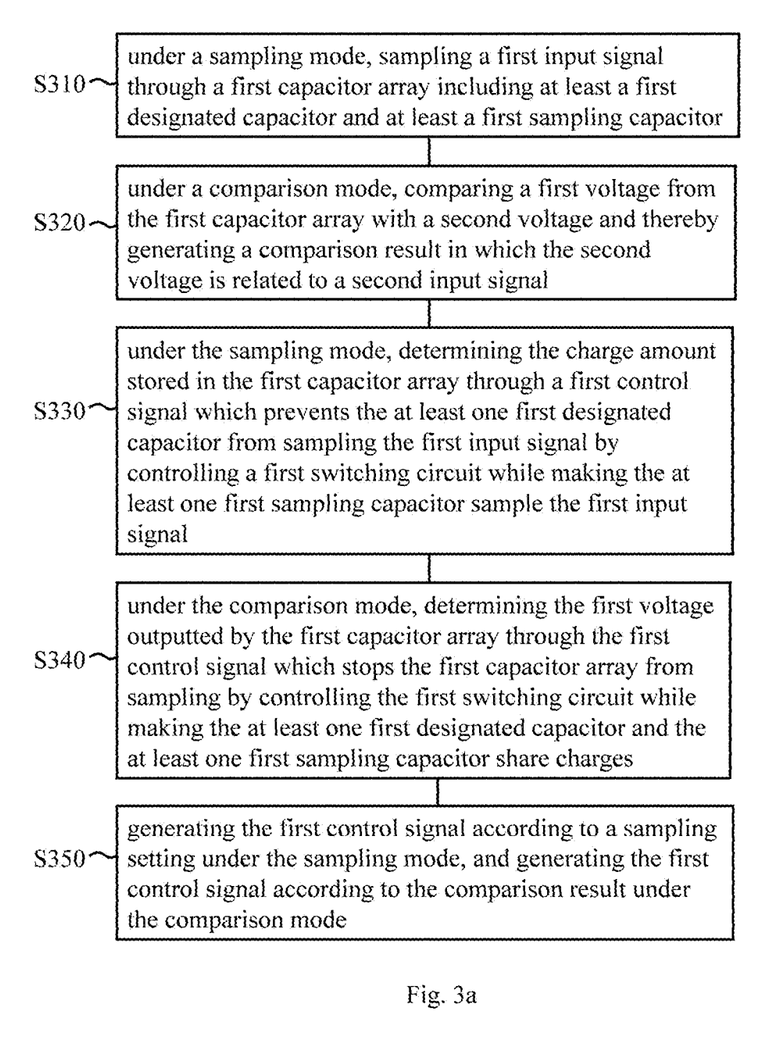
FIG. 3a illustrates an embodiment of the successive approximation analog-to-digital conversion method of the present invention.

In addition to the fore-disclosed device, the present invention also discloses a successive approximation analog-to-digital conversion method which can be carried out by the successive approximation analog-to-digital converter of this invention or the equivalent thereof. As it is shown in FIG. 3a, an embodiment of the method comprises the following steps:

Step S310: under a sampling mode, sampling a first input signal through a first capacitor array including at least a first designated capacitor and at least a first sampling capacitor. The first capacitor array here could be the first capacitor array 110 in FIG. 1a through FIG. 2b or its equivalent.

Step S320: under a comparison mode, comparing a first voltage from the first capacitor array with a second voltage and thereby generating a comparison result in which the second voltage is related to a second input signal which is the inversion of the first input signal or a predetermined reference signal. This step could be executed by the comparator 120 of FIG. 1a through FIG. 2b or the equivalent thereof.

Step S330: under the sampling mode, determining the charge amount stored in the first capacitor array through a first control signal which prevents the at least one first designated capacitor from sampling the first input signal by controlling a first switching circuit while making the at least one first sampling capacitor sample the first input signal. The first switching circuit here could be the first switching circuit 130 in FIG. 1a through FIG. 2b or its equivalent.

Step S340: under the comparison mode, determining the first voltage outputted by the first capacitor array through the first control signal which stops the first capacitor array from sampling by controlling the first switching circuit while making the at least one first designated capacitor and the at least one first sampling capacitor share charges. This step could be carried out by the control circuit 140 in FIG. 1a through FIG. 2b or its equivalent.

Step S350: generating the first control signal according to a sampling setting under the sampling mode, and generating the first control signal according to the comparison result under the comparison mode. This step could also be carried out by the control circuit 140 in FIG. 1a through FIG. 2b.

Figure 3B:
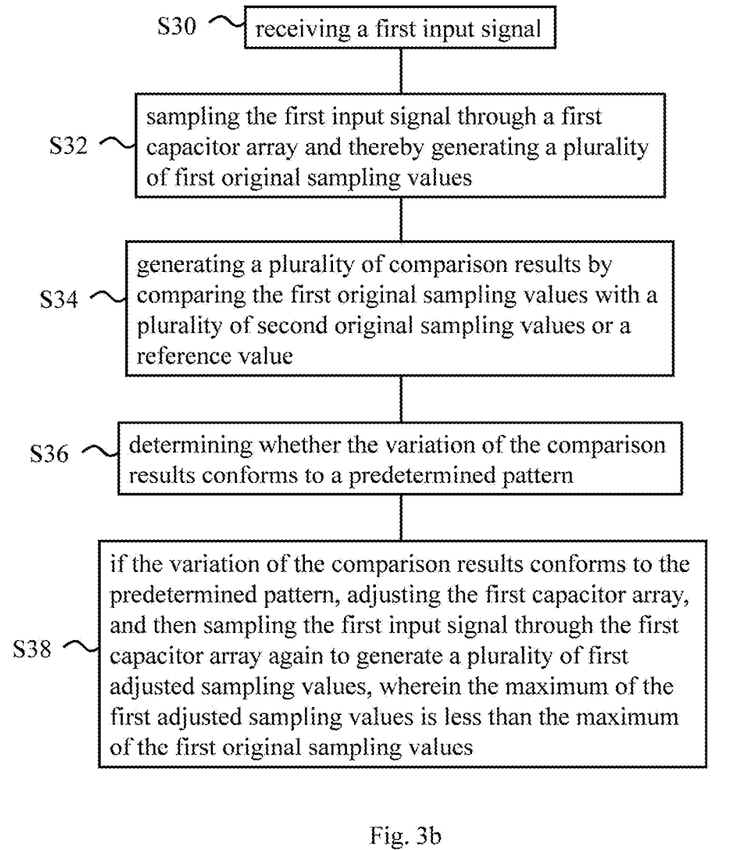
FIG. 3b illustrates another embodiment of the successive approximation analog-to-digital conversion method of the present invention.

Besides, another embodiment of the present method is operable to determine whether the sampling value of an input signal is improper and then determine whether it is necessary to make the reduction in the sampling value of the input signal. As it is shown in FIG. 3b, this embodiment comprises the following steps:

Step S30: receiving a first input signal.

Step S32: sampling the first input signal through a first capacitor array and thereby generating a plurality of first original sampling values. The first capacitor array here could be the first capacitor array 110 in FIG. 1a through FIG. 2b or its equivalent.

Step S34: generating a plurality of comparison results by comparing the first original sampling values with a plurality of second original sampling values or a reference value in which the second original sampling values could be the values generated by the aforementioned second capacitor array 150 or the reference value could be a predetermined constant voltage. This step could be carried out by the comparator 120 in FIG. 1a through FIG. 2b or its equivalent.

Step S36: determining whether the variation of the comparison results conforms to a predetermined pattern. In this embodiment, the predetermined pattern indicates that all the comparison results are equivalent (e.g. each of the comparison results is represented by bit 1, which implies that all the first original sampling values are more than the maximum among the second original sampling values or more than the reference value; or each of the comparison results is represented by bit 0, which implies that all the first original sampling values are less than the maximum among the second original sampling values or less than the reference value). This step could be executed by the control circuit 140 in FIG. 1a through FIG. 2b or the equivalent thereof.

Step S38: if the variation of the comparison results conforms to the predetermined pattern, adjusting the first capacitor array, and then sampling the first input signal through the first capacitor array again to generate a plurality of first adjusted sampling values, wherein the maximum of the first adjusted sampling values is less than the maximum of the first original sampling values. The said process of adjusting the first capacitor array could be realized through a means of making the voltages at the two electrode terminals of at least one first designated capacitor in the capacitor array be equivalent for the prevention of sampling, and a means of making the two electrode terminals of at least one first sampling capacitor be respectively coupled with the first input signal and a first reference signal for sampling the first input signal. Besides, the capacitances of the mentioned first designated capacitor and the first sampling capacitor amount to a total capacitance while the ratio of the maximum of the first original sampling values to the maximum of the first adjusted sampling values is determined in compliance with the ratio of the total capacitance to the capacitance of the at least one first sampling capacitor. This step, i.e. step S38, could be carried out by the cooperation of the control circuit 140, the switching circuit 130 and the first capacitor array 110 in FIG. 1a through FIG. 2b.

In consideration of that those of ordinary skill in the art can appreciate the implementation detail and the modification thereof by referring to the teaching and suggestion of the fore-described device embodiments, which means that every feature in the device embodiments can be applied to this method invention in a reasonable way, repeated and redundant description is therefore omitted.

Figure 4A:
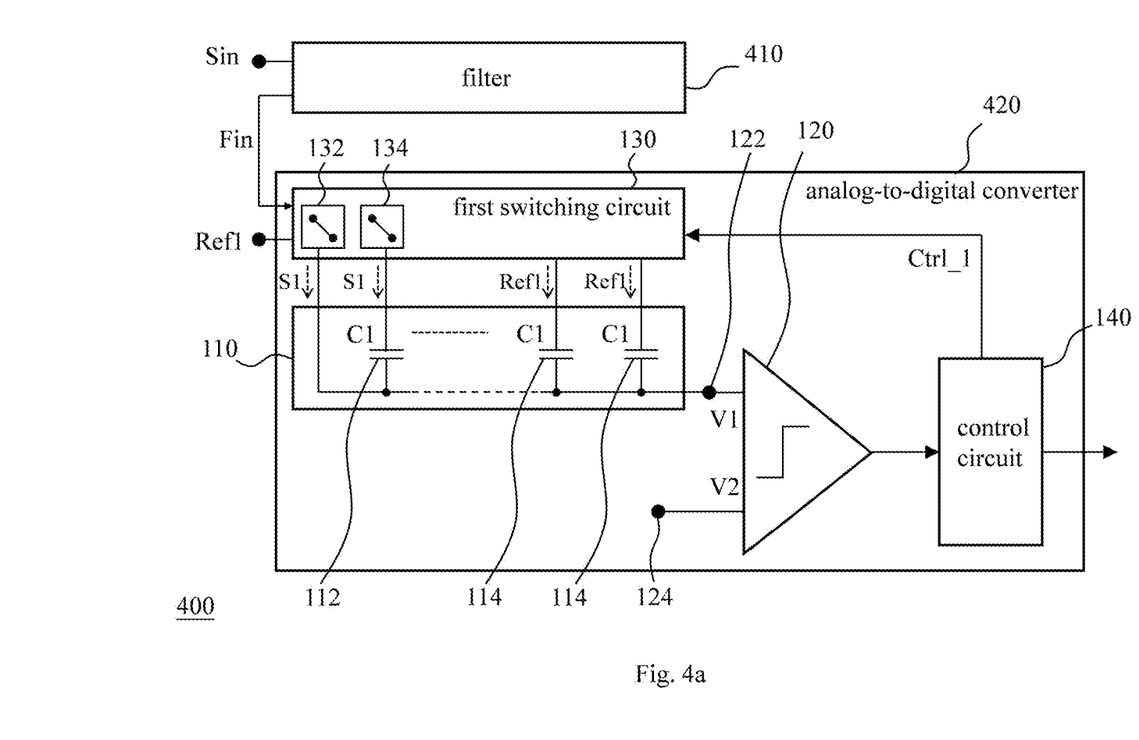
FIG. 4a illustrates an embodiment of a decoder adopting the successive approximation analog-to-digital converter of the present invention under a sampling mode.
Figure 4B:
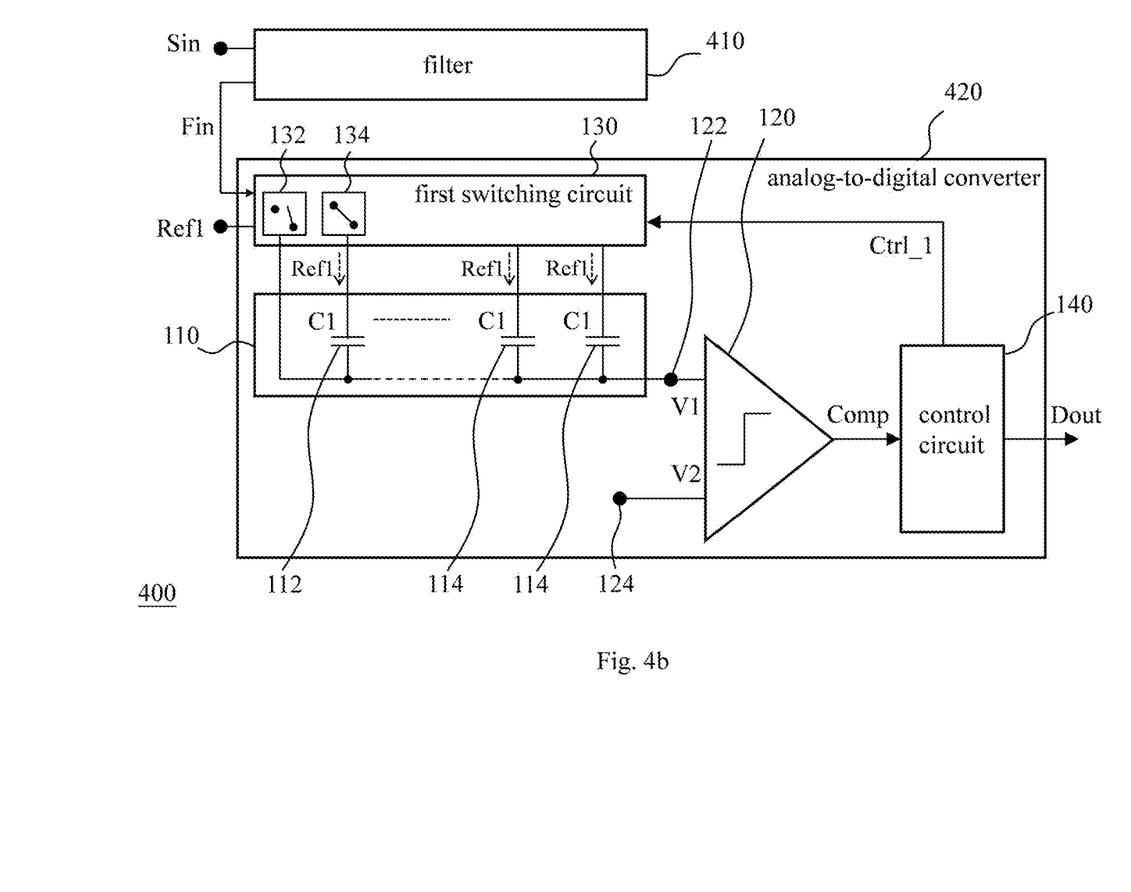
FIG. 4b illustrates an embodiment of a decoder adopting the successive approximation analog-to-digital converter of the present invention under a comparison mode.

In addition, the present invention discloses a decoder adopting the fore-disclosed successive approximation analog-to-digital converter, which is capable of preventing the fidelity loss caused by the undue sampling value without using any programmable gain amplifier. As it is shown in FIG. 4a and FIG. 4b, an embodiment of said decoder 400 comprises: a filter 410 operable to generate a filtered signal Fin according to an original signal Sin; and a successive approximation analog-to-digital converter 420 operable to generate a decoded signal Dout according to the filtered signal Fin. Said converter 420 could be the converter 100 in FIG. 1a through FIG. 2b, comprising: a first capacitor array 110, including a plurality of first capacitors C1 which include at least a first designated capacitor 112 and at least a first sampling capacitor 114, operable to sample a first input signal S1 through sampling the filtered signal Fin under a sampling mode (as shown in FIG. 4a); a comparator 120 operable to compare a first voltage V1 from the first capacitor array 110 with a second voltage V2 under a comparison mode and thereby generate a comparison result Comp (as shown in FIG. 4b); a first switching circuit 130, coupled with the first capacitor array 110, operable to determine the charge amount stored in the first capacitor array 110 according to a first control signal Ctrl_1 under the sampling mode and determine the first voltage V1 outputted from the first capacitor array 110 according to the first control Ctrl_1 signal under the comparison mode; and a control circuit 140, coupled with the comparator 120 and the first switching circuit 130, operable to generate the first control signal Ctrl_1 according to a sampling setting under the sampling mode and generate the first control signal Ctrl_1 according to the comparison result Comp under the comparison mode, wherein the first control signal Ctrl_1 is operable to prevent the at least one first designated capacitor 112 from sampling the first input signal S1 through the first switching circuit 130 under the sampling mode while making the at least one first sampling capacitor 114 sample the first input signal S1, and operable to stop the first capacitor array 110 from sampling through the first switching circuit 130 under the comparison mode while making the at least one first designated capacitor 112 and the least one first sampling capacitor 114 share charges.

Similarly, since people of ordinary skill in the art can appreciate the implementation detail and the modification thereof by referring to the fore-described device and method embodiments, which means that every feature in those embodiments can be reasonably applied to this decoder, repeated and redundant explanation is therefore omitted without failing the disclosure and enablement requirements.

Please note that although the detail of the comparator, switching circuit and control circuit in the above embodiments is moderately abridged, people of ordinary skill in the art can still carry out these circuits in accordance with this specification and the existing technique; therefore, the said embodiments put emphasis on the feature of the present invention rather than the known arts. Please further note that the shape, size, and ratio of any element and the step sequence of any flow chart in the figures are just exemplary for understanding, not for limiting the scope of this invention.

To sum up, the successive approximation analog-to-digital converter and conversion method and the decoder using the same of the present invention are capable of reducing the sampling value of an input signal (in which the sampling value intends its absolute value if the input signal is negative in the definition of circuitry operation) to prevent fidelity loss, and have at least the following advantages: uncomplicated design which could be realized without too much effort and cost; smart design capable of altering the sampling value of the input signal without using any programmable gain amplifier, which is good for cost and power saving.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A successive approximation analog-to-digital converter capable of determining the sampling value of an input signal, comprising:

a first capacitor array operable to sample a first input signal under a sampling mode, including a plurality of first capacitors which include at least a first designated capacitor and at least a first sampling capacitor while each of the first capacitors includes a first upper electrode terminal and a first lower electrode terminal;

a comparator operable to compare a first voltage from the first capacitor array with a second voltage under a comparison mode and thereby generate a comparison result;

a first switching circuit, coupled with the first capacitor array, operable to determine the charge amount stored in the first capacitor array according to a first control signal under the sampling mode and determine the first voltage outputted from the first capacitor array according to the first control signal under the comparison mode; and a control circuit, coupled with the comparator and the first switching circuit, operable to generate the first control signal according to a sampling setting under the sampling mode and generate the first control signal according to the comparison result under the comparison mode, wherein the first control signal is operable to prevent the at least one first designated capacitor from sampling the first input signal through the first switching circuit under the sampling mode while making the at least one first sampling capacitor sample the first input signal, and operable to stop the first capacitor array from sampling through the first switching circuit under the comparison mode while making the at least one first designated capacitor and the least one first sampling capacitor share charges.

2. The converter of claim 1, wherein the first switching circuit includes a first input switch and a first sampling control switch; under the sampling mode, the first control signal is operable to couple the first upper electrode terminal of the at least one first designated capacitor with the first input signal through the first input switch, couple the first lower electrode terminal of the at least one first designated capacitor with the first input signal through the first sampling control switch, and couple the at least one first sampling capacitor with the first input signal and a first reference signal through the first switching circuit; and under the comparison mode, the first control signal is operable to disconnect the first upper electrode terminal of the at least one first designated capacitor from the first input signal through the first input switch, couple the first lower electrode terminal of the at least one first designated capacitor with the first reference signal through the first sampling control switch, and achieve charge sharing through the connection between the first upper electrode terminals of the at least one first designated capacitor and the at least one first sampling capacitor.

3. The converter of claim 1, further comprising:

a second capacitor array operable to sample a second input signal and output the second voltage, including a plurality of second capacitors which include at least a second designated capacitor and at least a second sampling capacitor while each of the second capacitors includes a second upper electrode terminal and a second lower electrode terminal; and a second switching circuit, coupled with the second capacitor array, operable to determine the charge amount stored in the second capacitor array according to a second control signal under the sampling mode and determine the second voltage outputted from the second capacitor array according to the second control signal under the comparison mode while the control circuit is operable to generate the second control signal according to the sampling setting under the sampling mode and generate the second control signal according to the comparison result under the comparison mode, wherein the second control signal is operable to prevent the at least one second designated capacitor from sampling the second input signal through the second switching circuit under the sampling mode while making the at least one second sampling capacitor sample the second input signal, and operable to stop the second capacitor array from sampling through the second switching circuit under the comparison mode while making the at least one second designated capacitor and the least one second sampling capacitor share charges.

4. The converter of claim 3, wherein the second switching circuit includes a second input switch and a second sampling control switch; under the sampling mode, the second control signal is operable to couple the second upper electrode terminal of the at least one second designated capacitor with the second input signal through the second input switch, couple the second lower electrode terminal of the at least one second designated capacitor with the second input signal through the second sampling control switch, and couple the at least one second sampling capacitor with the second input signal and a second reference signal through the second switching circuit; and under the comparison mode, the second control signal is operable to disconnect the second upper electrode terminal of the at least one second designated capacitor from the second input signal through the second input switch, couple the second lower electrode terminal of the at least one second designated capacitor with the second reference signal through the second sampling control switch, and achieve charge sharing through the connection between the second upper electrode terminals of the at least one second designated capacitor and the at least one second sampling capacitor.

5. The converter of claim 3, wherein the capacitances of the first and second designated capacitors are equivalent, the capacitances of the at least one first sampling capacitor and the at least one second sampling capacitor are equivalent, and the first and second reference signals are equivalent.

6. The converter of claim 1, wherein the second input signal is the inversion of the first input signal.

7. The converter of claim 1, wherein the second input signal is a predetermined reference signal.

8. The converter of claim 1, wherein the control circuit selects at least one capacitor from the plurality of first capacitors as the at least one first designated capacitor through the first switching circuit according to the sampling setting or the analysis of a preceding comparison result.

9. A successive approximation analog-to-digital conversion method carried out by a successive approximation analog-to-digital converter for the determination of the sampling value of an input signal, comprising the following steps:

under a sampling mode, sampling a first input signal through a first capacitor array including at least a first designated capacitor and at least a first sampling capacitor;

under a comparison mode, comparing a first voltage from the first capacitor array with a second voltage and thereby generating a comparison result in which the second voltage is related to a second input signal which is the inversion of the first input signal or a predetermined reference signal;

under the sampling mode, determining the charge amount stored in the first capacitor array through a first control signal which prevents the at least one first designated capacitor from sampling the first input signal by controlling a first switching circuit while making the at least one first sampling capacitor sample the first input signal;

under the comparison mode, determining the first voltage outputted by the first capacitor array through the first control signal which stops the first capacitor array from sampling by controlling the first switching circuit while making the at least one first designated capacitor and the at least one first sampling capacitor share charges; and generating the first control signal according to a sampling setting under the sampling mode, and generating the first control signal according to the comparison result under the comparison mode.

10. The conversion method of claim 9, wherein the step of preventing the at least one first designated capacitor from sampling the first input signal includes:

under the sampling mode, making two electrode terminals of the at least one first designated capacitor receive the first input signal and making the at least one first sampling capacitor be coupled with the first input signal and a first reference signal through the first control signal controlling the first switching circuit, and the step of making the at least one first designated capacitor and the at least one first sampling capacitor share charges includes:

under the comparison mode, making the at least one first designated capacitor be coupled with the first reference signal and the at least one first sampling capacitor through the first control signal controlling the first switching circuit, so as to achieve charge sharing.

11. The conversion method of claim 9, wherein when the second input signal is the inversion of the first input signal, the conversion method further comprises:

sampling the second input signal through a second capacitor array including at least a second designated capacitor and at least a second sampling capacitor;

determining the charge amount stored in the second capacitor array through a second control signal which prevents the at least one second designated capacitor from sampling the first input signal by controlling a second switching circuit while making the at least one second sampling capacitor sample the second input signal;

under the comparison mode, determining the second voltage outputted by the second capacitor array through the second control signal which stops the second capacitor array from sampling by controlling the second switching circuit while making the at least one second designated capacitor and the at least one second sampling capacitor share charges; and generating the second control signal according to the sampling setting under the sampling mode, and generating the second control signal according to the comparison result under the comparison mode.

12. The conversion method of claim 11, wherein the step of preventing the at least one second designated capacitor from sampling the second input signal includes:

under the sampling mode, making two electrode terminals of the at least one second designated capacitor receive the second input signal and making the at least one second sampling capacitor be coupled with the second input signal and a second reference signal through the second control signal controlling the second switching circuit, and the step of making the at least one second designated capacitor and the at least one second sampling capacitor share charges includes:

under the comparison mode, making the at least one second designated capacitor be coupled with the second reference signal and the at least one second sampling capacitor through the second control signal controlling the second switching circuit, so as to achieve charge sharing.

13. The conversion method of claim 9, further comprising:

selecting one or more capacitors from the first capacitor array as the at least one first designated capacitor through the first switching circuit according to the sampling setting or the analysis of a preceding comparison result.

14. A successive approximation analog-to-digital conversion method carried out by a successive approximation analog-to-digital converter for reducing the sampling value of an input signal, comprising the following steps:

receiving a first input signal;

sampling the first input signal through a first capacitor array and thereby generating a plurality of first original sampling values;

generating a plurality of comparison results by comparing the first original sampling values with a plurality of second original sampling values or a reference value;

determining whether the variation of the comparison results conforms to a predetermined pattern; and if the variation of the comparison results conforms to the predetermined pattern, adjusting the first capacitor array, and then sampling the first input signal through the first capacitor array again to generate a plurality of first adjusted sampling values, wherein the maximum of the first adjusted sampling values is less than the maximum of the first original sampling values.

15. The conversion method of claim 14, wherein the first capacitor array includes at least a first designated capacitor and at least a first sampling capacitor while the step of adjusting the first capacitor array includes:

making the voltages at two electrode terminals of the at least one first designated capacitor be equivalent for sampling disablement, and making two electrode terminals of the at least one first sampling capacitor receive the first input signal and a first reference signal respectively to sample the first input signal accordingly.

16. The conversion method of claim 15, wherein the sum of the capacitances of the at least one first designated capacitor and the at least one first sampling capacitor is a total capacitance while the ratio of the maximum of the first original sampling values to the maximum of the first adjusted sampling values is determined in accordance with the ratio of the total capacitance to the capacitance of the at least one first sampling capacitor.

17. The conversion method of claim 14, wherein the predetermined pattern indicates that the comparison results are equivalent.

* * * * *